United States Patent [19]

Diels et al.

[11] Patent Number: 5,191,390
[45] Date of Patent: Mar. 2, 1993

[54] SOLID STATE LASER GYRO WITH INTERFEROMETRICALLY SUBSTRACTED NOISE

[75] Inventors: Jean-Claude M. Diels; Ming Lai, both of Albuquerque, N. Mex.

[73] Assignee: Honeywell Inc., Minneapolis, Minn.

[21] Appl. No.: 723,367

[22] Filed: Jun. 28, 1991

[51] Int. Cl.$^5$ .............................................. G01C 19/66
[52] U.S. Cl. ...................................... 356/350; 372/94
[58] Field of Search ........................... 356/350; 372/94

[56] References Cited

U.S. PATENT DOCUMENTS 3,433,568  3/1969  Skalski et al. ...................... 356/350

FOREIGN PATENT DOCUMENTS 3131233  3/1982  Fed. Rep. of Germany ...... 356/350

OTHER PUBLICATIONS

"Theory of the Holographic Laser: Correlated Emission in a Ring Cavity", Krause and Scully, Physical Review A, vol. 36, No. 4, Aug. 15, 1987.
"Ring-Laser Configuration with Spontaneous Noise Reduced by Destructive Interference of the Laser Outputs", M. Lai and J.-C. Diels, Physical Review A, vol. 42, No. 1, Jul. 1, 1990, pp. 536-542.
"Quantum Noise Quenching in the Correlated Spontaneous Emission Laser As a Multiplicative Noise Process, 1. A Geometrical Argument", W. Schleich and M. O. Scully, Physical Review A, vol. 37, 1261 et seq., 1988.
"A Correlated-Emission Laser Gyroscope", Marlan O. Scully, Physical Review A, vol. 35, No. 1, Jan. 1, 1987, pp. 452-455.
"Novel Wavelength-Resonant Optoelectronic Structure and Its Application to Surface-Emitting Semiconductor Lasers", M. Y. A. Raja, S. R. J. Brueck, M. Osinski, C. F. Schaus, J. G. McInerney, T. M. Brennan and B. E. Hammons (USA), Electronics Letters, An International Publication, 1st Sep., 1988, vol. 24, No. 18, pp. 1140-1142.

*Primary Examiner*—Samuel A. Turner
*Attorney, Agent, or Firm*—John G. Shudy, Jr.

[57] ABSTRACT

A ring laser apparatus for spontaneous-emission-free detection including several mirrors. Some of the mirrors including a first, second and third mirror are arranged to form a laser ring. A gain medium is located between two of the first, second and third mirrors within the laser ring. Radiation from an external radiation source impinges on a fourth mirror and is reflected to illuminate the gain medium. The gain medium thereby produces first and second oppositely traveling laser beams along first and second pathways, each of the pathways having equal path lengths. The first and second oppositely traveling beams each provide an output through one of the laser ring mirrors and are reflected into the beam splitter after respectively striking fifth and sixth mirrors. The gain medium comprises a gain layer having a thickness which is much smaller than a wavelength so that the oppositely directed first and second beams from the gain medium are highly coherent on the beam splitter. The beam splitter operates on the first and second oppositely traveling beams so as to provide a detection signal free of spontaneous emission noise to the detector.

24 Claims, 4 Drawing Sheets

SOLID STATE LASER GYRO WITH INTERFEROMETRICALLY SUBSTRACTED NOISE

FIELD OF THE INVENTION

The present invention relates generally to ring laser sensors, including rotation sensors, laser gyros, fluid velocity sensors and magnetic field sensors. In this context the present invention provides a ring laser configuration with reduced spontaneous emission noise through destructive interference of the laser outputs.

BACKGROUND OF THE INVENTION

It is well known that spontaneous emission sets a quantum limit to the laser linewidth. There are presently phase or frequency measurements where such a quantum limit has been reached. Therefore, a range of applications including metrology, high resolution spectroscopy, rotation or spatial anisotropy sensing by active ring lasers would benefit from any improvement of the influence of spontaneous emission noise on the measurement. The direct quantum solution to this problem is to minimize the phase noise at the expense of the noise in the conjugate quantities. Examples of implementation of the quantum solution are "correlated emission lasers" and "squeezed state" sources.

The instant invention provides an approach wherein the spontaneous emission is interferometrically decoupled from the quantity measured from the laser. The background of this approach is discussed in detail in an article entitled "Ring-laser Configuration with Spontaneous Noise Reduced by Destructive Interference of the Laser Outputs," M. Lai and J.-C. Diels, The Physical Review A, pp. 536-542, Vol. 42, No. 1 (1990) which is incorporated herein by reference. This technique takes advantage of the fact that spontaneous and stimulated emissions may have different symmetries in the opposite propagation directions of a ring laser cavity. The concept of the instant invention applies to gain media consisting of thin layers (where thickness $D<<\lambda$), for which the spontaneous emission can be minimized by destructive interferences. Even though the spontaneous emission from an atom or molecule is random, the oppositely directed emissions from an electrical dipole are exactly identical. That is, at the same distance from the source, the electromagnetic fields emitted in opposite directions have, at any instant, equal amplitude and phase. Therefore, they can be made to recombine and interfere via a pair of mirrors and a beam splitter. For an ideal destructive interference from a sheet of emitters of thickness D (where thickness $D<<\lambda$), the spontaneous emission minimum intensity (measured at one output of the beam splitter) is the fraction $\{1-[sinkD/kD]\}/2$ of the total florescence intensity at that point. The destructive interference condition still holds if the single emitting layer is replaced by a periodic structure of layers spaced by $\lambda/2$, as long as the total thickness is much less than the coherence length of the florescence radiation. If $\Delta\lambda$ is the radiation linewidth (half width at half maximum), a series of $(2N+1)$ layers with thickness D will result in a minimum florescence intensity (after destructive interference) of:

$$I_{min} = \frac{1}{2} \sum_{m=-N}^{m=+N} \left(1 - \frac{sinkD}{kD} \frac{sin(m\pi\Delta\lambda/\lambda)}{(m\pi\Delta\lambda/\lambda)}\right) I_0 \qquad (1)$$

Figure 1:
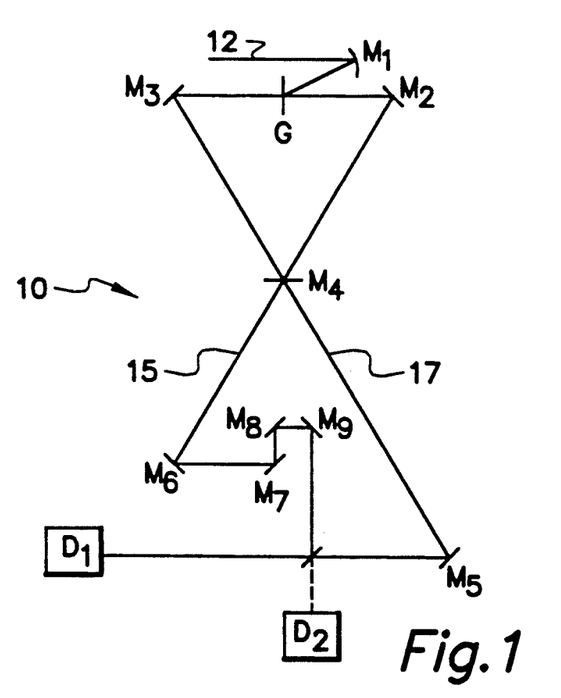
FIG. 1 is a schematic drawing of a configuration of a ring laser for spontaneous-emission-free detection in accordance with one aspect of the instant invention.

When the excited atoms are spatially confined in a ring laser cavity and located at half way of the perimeter from the output mirror, the two oppositely directed spontaneous emissions seen from the output mirror should be identical. On the other hand, the two counterpropagating waves of the ring laser may be different in amplitude or phase, due to the laser dynamics, such as mode competition. In particular, they may have different frequencies due to the gyro effect or due to magnetic field sensing. For example, for magnetic field sensing an embodiment of the invention may employ the well-known Verdet effect in one element of the cavity, or, alternatively employ well-known Zeeman splitting of some absorbing-amplifying elements in the cavity. The two outputs can then be combined, via a pair of mirrors and a beam splitter, in such a way that, at one of the beam splitter outputs, an optimum destructive interference is obtained for the spontaneous emission (FIG. 1). Within the approximation of a small number of thin $(D<<\lambda)$ gain layers, the laser beam from that output is free from the spontaneous emission.

THEORETICAL MODEL

Denoting by $a_1=\rho_1 e^{-\phi_1}$ and $a_2=\rho_2 e^{-\phi_2}$ the quantum field operators for the two counterpropagating modes in the ring cavity, we assume that the optical delays have been adjusted to result in the combination $(a_1+a_2)$ for the beam incident on detector $D_1$, and $(a_1-a_2)$ for the beam incident on detector $D_2$. The quantum Langevin's equations for the laser configuration are, in Heisenberg's representation, $$\dot{a}_1 = -i\Omega_1 a_1 + \tfrac{1}{2}\alpha_1 a_1 + \tfrac{1}{2}\alpha_{12} a_2 - \tfrac{1}{2}\gamma_1 a_1 + f_1, \qquad (2)$$

$$\dot{a}_2 = -i\Omega_2 a_2 + \tfrac{1}{2}\alpha_2 a_2 + \tfrac{1}{2}\alpha_{21} a_1 - \tfrac{1}{2}\gamma_2 a_2 + f_2 \qquad (3)$$

where $\Omega_1$ and $\Omega_2$ are the empty-cavity eigen-circular frequencies, $\alpha_1$ and $\alpha_2$ are the gain coefficients, $\alpha_{12}$ and $\alpha_{21}$ are cross-coupling coefficients, $\gamma_1$ and $\gamma_2$ are the loss coefficients, and $f_1$ and $f_2$ are the noise operators for the spontaneous emission. A useful quantity to be extracted from an actual measurement is the difference $\Omega_1-\Omega_2$ (proportional to the rate of rotation of the cavity, in an actual laser gyro application, or to a magnetic field, or to a small fluid flow velocity, such as, for example, the Fresnel drag effect.

The noise terms at the position of the beam splitter (originating from the operators $f_1$ and $f_2$) are equal in the proposed configuration, provided the laser cavity is isotropic in the clockwise and counterclockwise directions. The detection configuration can be adjusted for cancellation of the phase difference between the noise terms induced by the Sagnac effect when the cavity is rotated. In the configuration of FIG. 1, the Sagnac effect has opposite sign in the cavity and the detection loop. If $n=t_c P/c$ ($t_c$ being the cavity lifetime, P the perimeter, and c the speed of light) is the effective number of round trips in the laser cavity, the detection "ring" should be looped n times (using for instance fibers) for exact cancellation of the Sagnac effect on detectors $D_1$ and $D_2$. Even assuming that the detection geometry has not been adjusted to the active cavity lifetime, the small phase difference between $f_1$ and $f_2$ can be neglected for the purpose of the measurements considered here. The phase difference is typically very small. For example, if a rotation causes a frequency difference of 1 kHz between the two modes, and the lifetime for a photon in the laser cavity is 1 (e.g. assuming a 3M perimeter cavity with 1% loss per round trip), the relative phase difference between $f_1$ and $f_2$ is then smaller than $2\pi \ 10^{-3}$. In the following calculation, $f_1$ and $f_2$ are treated to be equal, i.e. $f_1=f_2=f$. It is only within the approximation that $f_1=f_2$ that the laser emission itself has properties of reduced phase noise. These properties are referred to as correlated emission and have been disclosed by Scully, Phys. Rev. Lett. 55, 2802 (1985) wherein he discloses a correlated emission laser. The present invention includes a new detection scheme which eliminates even the reduced noise of the correlated emission laser of the prior art.

The signal intensities recorded by detectors $D_1$ and $D_2$ are respectively proportional to $I_+ = <|(a_1+a_2)(a_1^+ + a_2^+)|>$ and $I_- = <|(a_1-a_2)(a_1^+ - a_2^+)|>$. For the subtraction channel, one has, from equations (2) and (3):

$$\dot{a}_1 - \dot{a}_2 = (-i\Omega_1 a_1 + \tfrac{1}{2}\alpha_1 a_1 + \tfrac{1}{2}\alpha_{12} a_2 - \tfrac{1}{2}\gamma_1 a_1) - (-i\Omega_2 a_2 + \tfrac{1}{2}\alpha_2 a_2 + \tfrac{1}{2}\alpha_{21} a_1 - \tfrac{1}{2}\gamma_2 a_2) \quad (4)$$

and $$\dot{I}_- = <|(\dot{a}_1-\dot{a}_2)(a_1^+ - a_2^+) + (a_1-a_2)(\dot{a}_1^+ - \dot{a}_2^+)|> \quad (5)$$

which is indeed free from spontaneous emission noise. For the sum channel, one finds:

$$\dot{a}_1 + \dot{a}_2 = (-i\Omega_1 a_1 + \tfrac{1}{2}\alpha_1 a_1 + \tfrac{1}{2}\alpha_{12} a_2 - \tfrac{1}{2}\gamma_1 a_1) + (-i\Omega_2 a_2 + \tfrac{1}{2}\alpha_2 a_2 + \tfrac{1}{2}\alpha_{21} a_1 - \tfrac{1}{2}\gamma_2 a_2) + 2f \quad (6)$$

and $$\dot{I}_+ = <|(\dot{a}_1+\dot{a}_2)(a_1^+ + a_2^+) + (a_1+a_2)(\dot{a}_1^+ + \dot{a}_2^+)|>. \quad (7)$$

It results from Eqs. (6) and (7) that the sum channel carries all the spontaneous emission noise from the laser.

Figure 2:
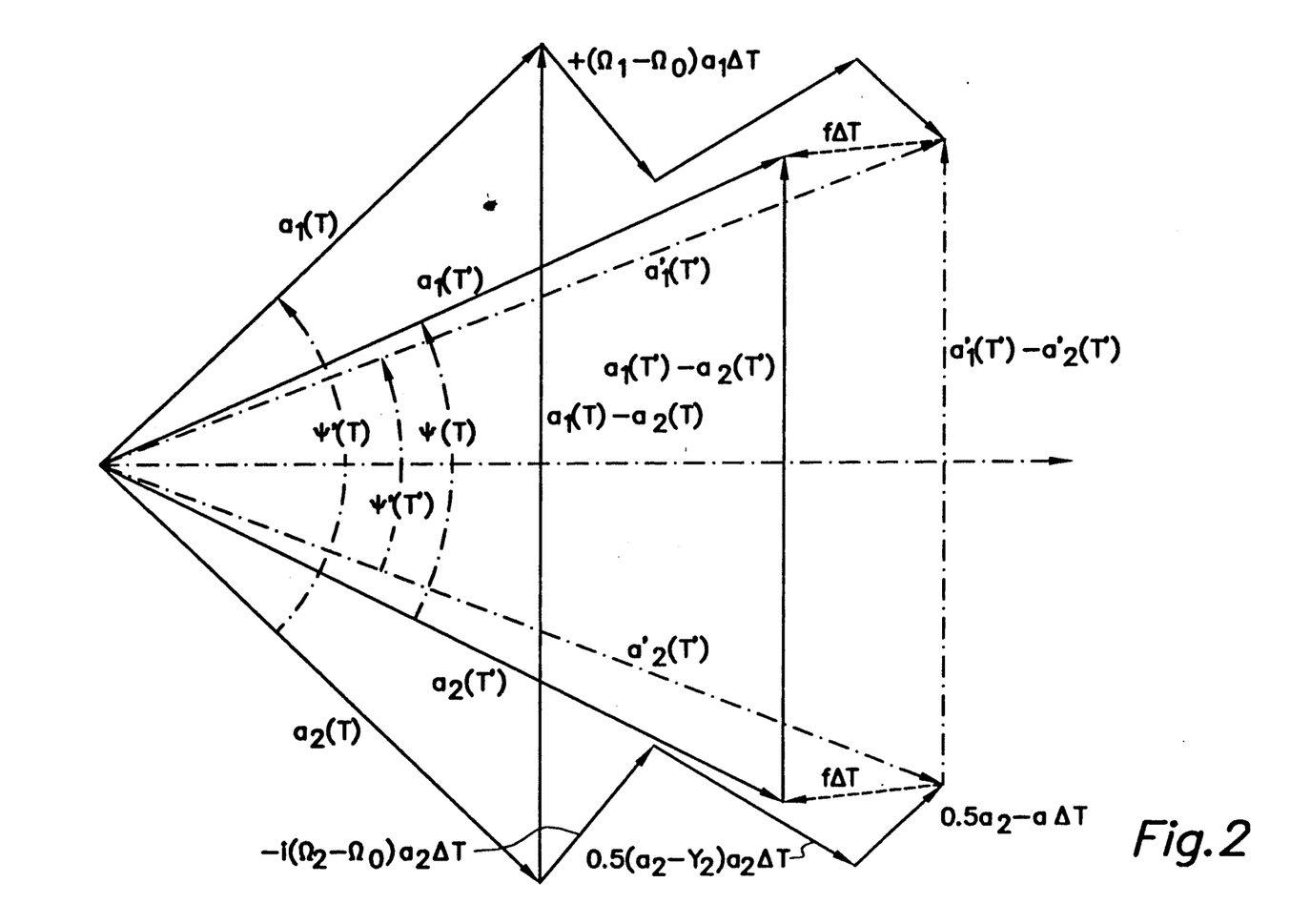
FIG. 2 is a vectorial representation of the influence of spontaneous emission in an active laser gyro.

It should be emphasized that, while the complex difference $a_1-a_2$ is free from spontaneous emission noise, the same does not apply to the individual amplitudes $\rho_1, \rho_2$ and to the derivative of the relative phase $\psi = \phi_1 - \phi_2$. This particular noise cancellation condition is sketched in the vector diagram of FIG. 2. While the vector difference $a_1(t+\Delta t) - a_2(t+\Delta t)$ is not influenced by the fluctuation of spontaneous emission noise $f\Delta t$, the phase difference $\psi(t+\Delta t)$ is affected.

It is of course desirable to extract the useful information $\Omega_1 - \Omega_2$ directly from the measurement of $\dot{I}_-$. On the other hand, the signal to be measured $\Omega_1 - \Omega_2$ cannot be determined unambiguously without a full knowledge of $\rho_1$ and $\rho_2$. When the coupling rate $\alpha_{12}$ and $\alpha_{21}$ are comparable with $\Omega_1 - \Omega_2$, $\rho_1, \rho_2$ and $\psi$ are strongly coupled to each other. There are however practical limits where the configuration of FIG. 1 leads directly to a measurement free of spontaneous emission noise. Some examples are discussed below.

For a thin film structure of homogeneously broadening gain medium, one has $\alpha_1 = \alpha_2 = \alpha_{12} = \alpha_{21} = \alpha$. With the additional simplification that $\gamma_1 = \gamma_2 = \gamma$, Eqs. (4) and (5) reduce to:

$$\dot{a}_1 - \dot{a}_2 = -i\Omega_1 a_1 + i\Omega_2 a_2 - \tfrac{1}{2}\gamma(a_1-a_2) \quad (8)$$

and $$\dot{I}_- = <|[-i\Omega_1 a_1 + i\Omega_2 a_2 - \tfrac{1}{2}\gamma(a_1-a_2)](a_1^+ - a_2^+) + (a_1-a_2)[i\Omega_1 a_1^+ - i\Omega_2 a_2^+ - \tfrac{1}{2}\gamma(a_1^+ - a_2^+)]|> = \quad (9)$$

$$2\rho_1\rho_2(\Omega_1-\Omega_2)\sin\psi - \gamma(\rho_1^2 + \rho_2^2 - 2\rho_1\rho_2\cos\psi).$$

Equation (9) is the physical quantity measured directly on a detector $D_2$ in the configuration of FIG. 1. Explicit analysis of the noise term, represented by the last term of Eq. (9), can be found in the work of Scully, Phys. Rev. A 35, 452 (1987) and Schleich and Scully, Phys. Rev. A 37, 1261 (1988). The physical situation being considered in the immediately aforementioned two references is such that a time dependent phase difference $\psi$ is being directly detected, rather than the intensity $\dot{I}_-$. The approximation of equal amplitude $\rho_1 = \rho_2$ leads to the same form of noise term as in the Scully, Phys. Rev. A 35, 452 (1987) reference (Eq. 11b). However, because of the coupling of phase and amplitude in a rotating laser, such an assumption cannot be made in the physical situation of FIG. 1, where periodic intensity (amplitude) modulations are induced by a rotation.

For $(\Omega_1-\Omega_2) >> \alpha$ and $\gamma$, the two counterpropagating waves run freely, and equation (9) becomes $$\dot{I}_- = 2\rho_1\rho_2(\Omega_1-\Omega_2)\sin\psi, \quad (10)$$

which is the expression for the beat intensity between two waves at $\Omega_1$ and $\Omega_2$, and therefore, the phase difference is indeed the "unlocked" response:

$$\dot{\psi} = \Omega_1 - \Omega_2. \quad (11)$$

For $(\Omega_1-\Omega_2) << \alpha$ and $\gamma$, the two modes are tightly locked to each other with a fixed phase difference and an equal amplitude $\rho_1 = \rho_2 = \rho$. In that situation, $I_-$ remains a constant, and equation (9) leads to:

$$(\Omega_1-\Omega_2)\sin\psi - \gamma(1-\cos\psi) = 0. \quad (12)$$

In the limit of $\psi < 1$:

$$\psi = 2(\Omega_1-\Omega_2)/\lambda, \quad (13)$$

which is similar to the result obtained from the CEL laser when the noise term is neglected. Equation (13) implies that the information on small rotations can only be extracted from a phase difference measurement as in a passive laser gyro (fiber gyro for instance), and, therefore, the advantages as an active gyroscope are lost. The present invention provides a simple method to retain a frequency response even at small differences $(\Omega_1-\Omega_2)$ between the empty cavity frequencies as is discussed further in detail herein. Such techniques should lead to laser gyro's with small lock-in frequencies and reduced spontaneous emission noise.

Two arguments can be put forward to interpret the preceding results from the view point of cavity quantum electrodynamics. For the sake of discussion, we assume in this section the configuration of FIG. 1 to be ideally symmetric about the gain layer, and to be isotropic in the clockwise (cw) and counterclockwise (ccw) directions.

In the first approach, one starts with the assumption that the total spontaneous emission detected at the subtraction channel is equal to the absolute square of the sum of all of the probability vectors which correspond to all the possible routes for a photon coming from an excited atom (or the gain layer) to that channel. A spontaneously emitted photon can, for example, travel clockwise in the cavity to the output mirror $M_4$, then through $M_4$ to B. It can also be reflected from $M_4$, make one round trip and then go through $M_4$ and B, and so on. For any probability vector which corresponds to the photon taking clockwise a given number of round trips and then making its way to the subtraction channel, there is a probability vector which corresponds to the photon taking counterclockwise the same number of round trips and then making its way to that channel. This pair of probability vectors are identical except a phase difference of $\pi$ at the beam splitter. Therefore, the total sum of the probability vectors is zero and the subtraction channel sees no spontaneous emission. A similar argument will lead to the conclusion that the sum channel sees all the spontaneously emitted photons transmitted from the output mirror.

In the second approach, one starts with the assumption that the total spontaneous emission detected at the subtraction channel is equal to the absolute square of the sum of all the probability vectors which correspond to, at that channel, the contributions of all the possible cavity modes for a photon to couple into from an excited atom (or the gain layer). As an isotropic ring cavity, it supports only standing modes. While a photon is spontaneously emitted along the cavity axis, it couples only to the standing modes. Unlike the standing modes of a linear cavity, there is no boundary condition to restrain the nodes or antinodes of the standing modes in a ring cavity. But, when an excited atom or a gain layer is introduced into the cavity, any mode excited by a spontaneously emitted photon, from the consideration of symmetry, must have an antinode overlapped with the atom or the gain layer. Consequently, the two outputs of the mode have a well defined phase relationship upon arrival on the beam splitter in FIG. 1, and the mode, therefore, gives zero contribution to the subtraction channel. The subtraction channel sees no spontaneously emitted photon emitted because there is no standing mode excited by spontaneous emission that can contribute to it. Again, a similar argument will lead to the conclusion that the sum channel sees all the spontaneously emitted photons coupled into the standing modes.

For the sake of comparison, let us apply the former arguments to a conventional ring laser with a conventional thick (compared to the wavelength) gain medium. We had previously considered a gain layer which is much thinner than a wavelength, located at equal distance (cw and ccw) from the beam splitter. If the gain layer is moved $\lambda/4$ from the symmetric location, either of the above arguments shows that the subtraction channel sees a constructive interference of the spontaneous emission instead of a destructive one. Therefore, summing for a thick gain medium the contribution from a large number of layers will result in an equal amount of spontaneous emission in the two detection channels, consistent with the behavior of any conventional ring laser.

SUMMARY OF THE INVENTION

A ring laser apparatus for spontaneous-emission-free detection including several mirrors is provided by the present invention. At least three of the mirrors including a first, second and third mirror are arranged to form a laser ring. A gain medium is located between two of the first, second and third mirrors within the laser ring. Radiation from a source of energy, as, for example, direct electrical pumping or an external radiation source excites the gain medium. If an external radiation source is employed, it directs radiation to impinge off of, for example, a fourth mirror and the radiation is reflected onto the gain medium. By such mechanisms, the gain medium thereby produces first and second oppositely traveling laser beams along first and second pathways, each of the pathways having equal path lengths. A beam splitter is included in the apparatus to prevent coupling of counterpropagating beams, an example of such a structure is included in the preferred embodiment of the invention. The first and second oppositely traveling beams each provide an output through one of the laser ring mirrors and are reflected into the beam splitter after respectively striking fifth and sixth mirrors. The gain medium comprises a single gain layer or multiple gain layers, each layer having a thickness which is much smaller than a wavelength and a spacing between layers of about half a wavelength, so that the oppositely directed first and second beams from the gain medium are highly coherent when they impinge upon the beam splitter. The beam splitter operates on the first and second oppositely traveling beams so as to provide a detection signal free of spontaneous emission noise to the detector.

Other objects, features and advantages of the invention are apparent through the description of the preferred embodiment, claims and drawings herein wherein like numerals refer to like elements.

DESCRIPTION OF THE PREFERRED EMBODIMENT

The backward stimulated emission can be treated as a reflection from a surface and therefore can be compensated by inserting into the laser cavity interfaces with appropriate reflectivity (in amplitude and phase). As the coupling between the two waves is reduced, the gain saturation effect needs to be taken into account. For the sake of convenience in examining the gyro behavior of the laser and in making a comparison of the laser with the conventional laser gyros, we will ignore the spontaneous emission noise and use the semiclassical theory of lasers in this section. The feature of the spontaneousemission-free laser output is preserved as long as the configuration is symmetric about the gain layer and is isotropic for the cw and ccw directed modes. For the "thin layer" laser of FIG. 1, the counterpropagating beams intensities and the phase difference between the oppositely directed fields can be calculated from the system of equations:

$$\frac{dI_1}{d(t/\tau_c)} = \{a_{s1} - a_L I_1 + 2(I_1 I_2)^{\frac{1}{2}}[r_2\cos(\psi + \epsilon_2)]\} \quad (14)$$

$$\frac{dI_2}{d(t/\tau_c)} = \{a_{s2} - a_L I_2 + 2(I_1 I_2)^{\frac{1}{2}}[r_1\cos(\psi + \epsilon_1)]\} \quad (15)$$

where the saturated gain is defined by:

$$a_{si} = \frac{a[I_i + (I_1 I_2)^{\frac{1}{2}}\cos(\psi)]}{1 + \beta(I_1 + I_2) + 2\beta(I_1 I_2)^{\frac{1}{2}}\cos(\psi)} \quad (16)$$

where $i=1, 2$. $a_L$ is the linear loss coefficient of the cavity. $r_i$ and $\epsilon_i$ are the amplitude and phase of the backscattering (as created by the additional interfaces) of the beam $i$ into the counterpropagating beam 1 or 2, and $\tau_c = P/C$ is the cavity round-trip time. The differential equation for the phase shift between the counterpropagating beams is:

$$\frac{d\psi}{d(t/\tau_c)} = (\Omega_1 - \Omega_2)\tau_c - a_s - \quad (17)$$

$$\left[r_1\left[\frac{I_1}{I_2}\right]^{\frac{1}{2}}\sin(\psi - \epsilon_1) + r_2\left[\frac{I_2}{I_1}\right]^{\frac{1}{2}}\sin(\psi + \epsilon_2)\right]$$

where $a_s$ is the saturable backward coupling:

$$a_s = \frac{\frac{1}{2}a|\sqrt{I_1/I_2} + \sqrt{I_2/I_1}|\sin\psi}{1 + \beta(I_1 + I_2) + 2\beta[(I_1 I_2)]^{\frac{1}{2}}\cos\psi} \quad (18)$$

Here, unlike the treatment in section 2, we follow the conventional approach to separate the phase difference $\psi$ from the intensities $I_1$ and $I_2$ of the cw and ccw modes. In Eqs. 16 through 18, $\beta$ is the inverse of the self-saturation intensity.

Figure 3:
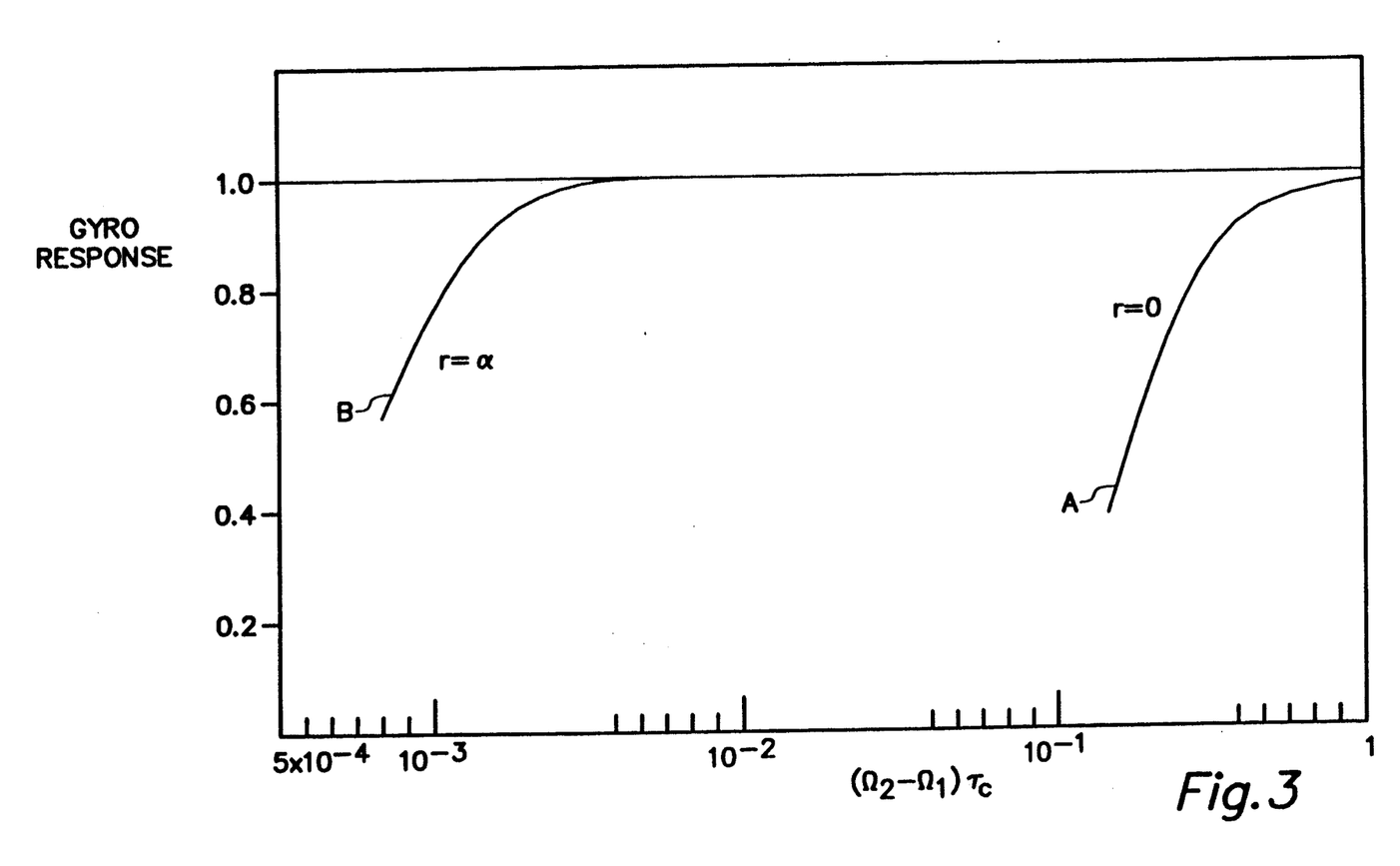
FIG. 3 is a graphical representation of typical response for a laser gyro showing the effects of backscattering on reducing the minimal detectable rotation.

An example of gyroscopic response is plotted in FIG. 3 for a laser with small saturation factor and large linear losses. The introduction of a backscattering coefficient of magnitude equal to half of the gain, and phase shift $\pi$, increases the range of gyro-operation. FIG. 3 is not the result of an optimization of the operation of thus type of gyro, but an illustration of the coupling effect of the thin film gain structure, and the possibility to correct for it by controlled backscattering. In the particular example of FIG. 3, the 98% gyro response occurs for a 300 times smaller value of $(\Omega_2 - \Omega_1)\tau_c$.

Just as for any conventional ring laser, one might expect from the above equations that the laser may operate on two modes simultaneously or one mode only, depending on the strength of the coupling and the competition between the two modes. Surprisingly, however, we find the gyro operation to be stable against unsymmetrical intensity fluctuations. Indeed, the results of the calculations illustrated in FIG. 3 are not affected by a 10% initial imbalance in the counterpropagating beams. Other methods leading to improved potential performances of this rotation sensor can be considered. For instance, as in the case of conventional gyros, the inclusion of four wave mixing in the cavity may lead to a further extension of the useful band of this gyro.

The thin film laser can either be a multiple quantum well semiconductor laser, or semiconductor laser pumped "stoichiometric lasers", also known as "high concentration" lasers or "self activated lasers". For an evaluation of the potential performances of a miniature laser gyro (for instance one having a 3 cm perimeter) based on this principle, we will consider layers of $KNdP_4O_{12}$ laser material grown on a $KLaP_4O_{12}$ substrate. The saturation intensity for that material is roughly 1 kw/cm$^2$. We take the gain coefficient and linear losses to be $10^{-4}$ and 0.996 $10^{-4}$, respectively, associated with a controlled backscattering of $r=0.5 \ 10^{-4}$ and phase $\pi$. For a laser power $P_{Laser}=1\mu$ Watt, we estimate the contribution of spontaneous emission to the linewidth $[\Delta\nu = (4\pi h\nu/P_{Laser})\Delta V^2_{cavity}]$. If the gain medium is made of 20 layers of 0.015 $\lambda$ thickness, the reduction factor for the noise is $2 \times 10^{-3}$. Therefore, the noise subtraction scheme applied to this model laser gyro would enhance the accuracy in rotational measurement by a factor of 500.

Now refer to FIG. 1 which shows a schematic drawing of a configuration of a ring laser for spontaneous-emission-free detection in accordance with one aspect of the instant invention. The laser gyro 10 includes a plurality of mirrors $M_1$, $M_2$, $M_3$, $M_4$, $M_5$, $M_6$, $M_7$, $M_8$ and $M_9$, first and second detectors $D_1$ and $D_2$, gain medium G, and a beam splitter B. Radiation 12 from an external radiation source, such as a laser source, impinges on mirror $M_1$ and is directed to illuminate the gain medium G. The gain medium G thereby produces two oppositely traveling laser beams along first and second pathways (i.e. $GM_2M_4M_6M_7M_8M_9B$ and $GM_3M_4M_5B$). The two oppositely traveling beams each provide an output 15, 17 through partially reflecting mirror $M_4$. In the configuration of the ring laser gyro 10, mirrors $M_2$, $M_3$, and $M_4$ form a ring laser cavity, and mirrors $M_5$ and $M_6$ are used to reflect the two outputs 15, 17 from the laser to combine at the beam splitter B. The two pathways from the gain layer G to the beam splitter B are equal. The thickness of the gain layer is much smaller than a wavelength so that the oppositely directed fluorescence from the gain medium is highly coherent on the beam splitter.

It has been shown in an experimental demonstration at the University of New Mexico Physics and Astronomy Department that the two opposite directions of spontaneous emission from a thin layer of florescence source are highly correlated. Therefore, the laser gyro 10 configuration achieves a destructive interference of the spontaneous emission in one of its outputs. Operating as an active laser gyro, a beat signal free from the spontaneous emission noise may be obtained. Operating as a single mode laser, or a locked but unbalanced two mode laser, an output with a frequency uncertainty limit below the Shawlow-Townes linewidth is provided.

It has recently become possible to manufacture laser media consisting of thin layers (i.e. media having layer thickness less than the light wavelength). The semiconductor versions of such lasers are Multiple Quantum Well (MQW) lasers, also called "Surface Emitters". Other lasers that can be built with this structure are "stoichiometric lasers", also known as "high concentration" lasers or "self activated lasers". Using the methods and apparatus of the instant invention, one can make a laser with this structure, in a configuration such that the spontaneous noise from the laser is not detected. By controlling the backscattering in such a ring laser, one can reduce to a very small amount the coupling between counterpropagating beams. It is a consequence of the absence of coupling that the ring laser configuration of FIG. 1 becomes a very sensitive rotation sensor, or magnetic field sensor as described further hereinbelow with reference to FIG. 4.

Figure 4:
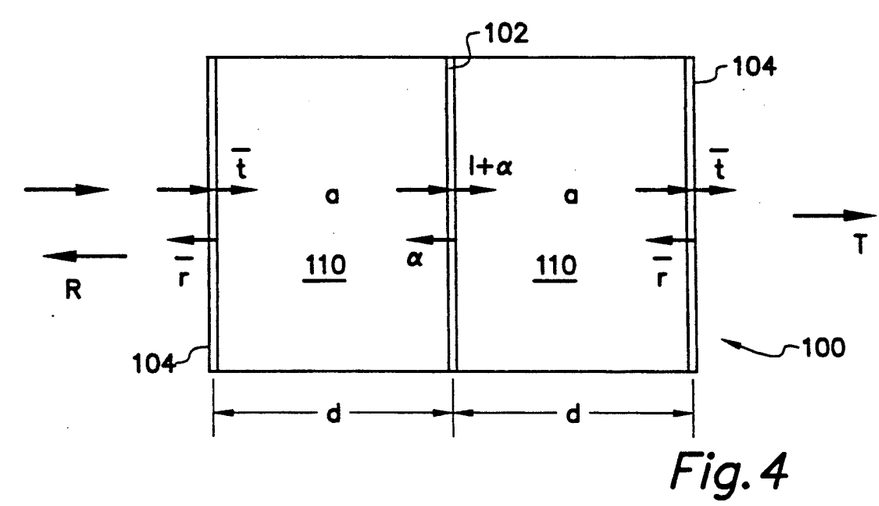
FIG. 4 is a schematic illustration of a gain resonator with a thin gain medium in its middle in accordance with one aspect of the present invention.

FIG. 4 is a schematic illustration of a gain resonator with a thin gain medium in its middle in accordance with one aspect of the present invention. The basic idea of the spontaneous emission noise free laser is to detect the beat signal between the two counterpropagating waves of a ring laser at equal distances from the gain layer, and to interferometrically subtract the spontaneous emission noise. Detection free of spontaneous emission noise is important for rotation sensing applications, provided gyro response can be obtained in a ring laser with thin film gain media. The instant invention provides a means for overcoming fundamental obstacles to the gyro effect in this type of rotation sensing. These obstacles include mutual coupling or "lock-in" between oppositely traveling laser beams due to the homogeneous broadening of the gain medium, and the coupling introduced by thin gain layers. Indeed, for thin layer gain structures, the stimulated emission occurs in the forward as well as the backward direction, thus causing a strong coupling between the counterpropagating modes in a ring cavity. A solution to these problems is provided by the instant invention through the insertion of a thin layer structure between dielelectric reflectors, and to include a weak distributed gain.

Still referring to FIG. 4, a gain resonator 100 with a thin gain medium of gain $\alpha$ in its middle is shown. The gain resonator 100 is bounded by first and second dielectrics 104 of complex field reflectivity $\bar{r}$ and transmission $\bar{t}$. The medium inside the resonator structure has a distributed gain a ($a < < \alpha$). The resonator 100 has a structure which includes a single or multiple active layers of thickness $< < \lambda$ where each layer is separated by half a wavelength and gain $\alpha$ (field gain) inserted between two reflecting layers having a complex reflection coefficient $r = re$ located at a distance d on either side.

Figure 5:
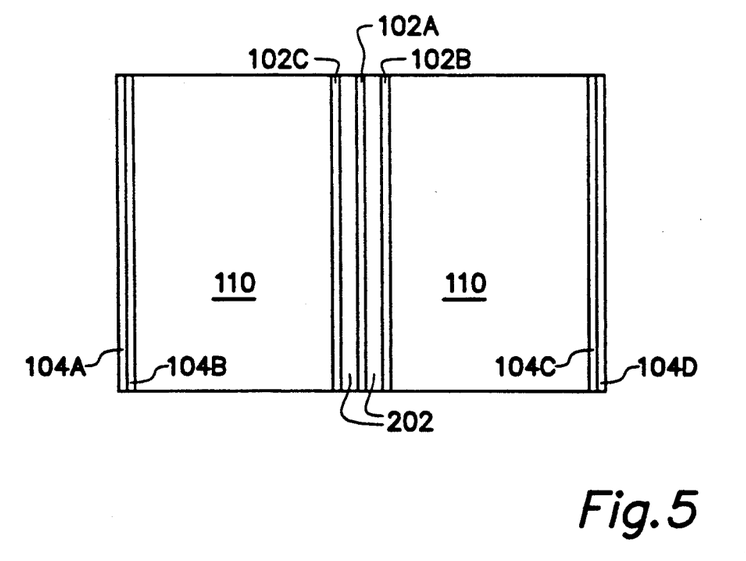
FIG. 5 is a schematic illustration of a gain resonator with a thin gain medium including a plurality of gain layers and a plurality of dielectric layers.

As shown in FIG. 5, the active layers of sub-wavelength thickness include, for example, a plurality of layers 102A, 102B and 102C separated by dielectric layers 202 having a thickness of about ½ a wavelength. The dielectric 202 may advantageously be a semiconductor material with dielectric properties. Further, a plurality of layered dielectrics 104A–104D form the boundaries of the gain resonator. Each of the layered structures may include, for example, about 10 or 20 layers of material.

The medium 110 between the reflectors has a distributed gain $a < < \alpha$. The field reflection R and transmission T of the resonator 100 can be expressed as a function of the gain $\alpha$ and the reflection coefficient r:

$$T = \frac{-(1 - r^2)(1 + a)x}{1 - 2rax - (1 + 2a)r^2x^2} e^{i\phi r} \quad (19)$$

$$R = \frac{r - a(1 + r^2) - r(1 + 2a)^2}{1 - 2ra - (1 + 2a)r^2} e^{i\phi r} \quad (20)$$

where $x = (1+a)^2 e^{i(2kd - pr)}$. To prevent phase locking of two counterpropagating modes when the structure of resonator 100 is inserted in a ring cavity, the total back-scattering should be either zero, or a purely dielectric scattering.

The distance d has to be chosen to compensate the phase shift on reflection of the dielectric coatings. If r is a positive number, the thickness d has to satisfy the condition $2kd + \phi r = (2N + 1)\pi$ where N is an integer. The fact that the resonator 100 is designed for an antisymmetric mode prevents oscillation even when the gain exceeds $1 - r$. When $d \leq \lambda$, the mode spacing of the resonator exceeds the linewidth of the gain medium.

In one example embodiment of the invention, each of the three layers of resonator 100 corresponds to a multilayer structure. The thin gain layer is replaced by a multiple quantum well structure which typically may have 10 to 20 layers. A multilayer coating is needed to obtain the specified reflectivity r. The feasibility of the resonator structure has been verified using a program based on matrix formulation of multilayer coatings. The parameters corresponding to an integrated $GaAl_x As_{1-x}$ surface emitter were used in those calculations. The particular calculated value of the phase shift upon reflection of the dielectric stack of reflectivity r leads to the exact thickness d of the transition layer 110. Such a surface emitter is disclosed in a paper by Raja et al., entitled "Surface-emitting, Multiple Quantum Well GaAs/AlGaAs Laser with Wavelength-resonant Periodic Gain Medium," Electron. Lett., 24:1140–1142, 1988. The transition layer must be sufficiently thin to ensure that the mode spacing of the resonator 100 is larger than the gain bandwidth of the thin gain layer multiple quantum well stack. That is, d should be on the order of a wavelength.

When such a structure is inserted in a ring laser, the counterpropagating fields inside the resonator $\bar{E}_a = \epsilon_a \exp(i\lambda_a)$ and $\bar{E}_b = \epsilon_1 \exp(i\lambda_1)$ are a function of the amplitude and phase of the fields circulating in the cavity $\bar{E}_1 = \epsilon_1 \exp(i\lambda_1)$ and $\bar{E}_2 = \epsilon_a \exp(i\lambda_2)$. The distributed gain will saturate as $$a_1 = \frac{a_0}{1 + \frac{I_a + 2I_b}{I_s}} \quad (21)$$

$$a_2 = \frac{a_0}{1 + \frac{I_b + 2I_a}{I_s}} \quad (22)$$

where the subscripts 1 and 2 refer to the direction of the external fields $E_1$ and $E_2$ and $I_s$ is the saturation intensity of the gain medium. The fields $I_a$ and $I_b$ inside the micro Fabry-Perot cavity are a function of the relative phase $\psi = \lambda_2 - \lambda_1$ of the external fields. For example, the intensity of the internal field $I_a$ propagating in the direction of the external (to the Fabry-Perot) field $I_1$ is given by:

$$I_a = \frac{(R + |r|)I_2 + T_1^2 I_1 - 2(R + |r|)T_1 \sqrt{I_1 I_1} \cos\psi}{(1 + a_1)^2 (1 - |r|^2)} \quad (23)$$

A similar expression applies to the field $I_b$. The phase dependence indicates whether the counterpropagating fields of the ring cavity will interfere constructively or destructively inside the gain structure. The localized gain layer will saturate according to: where the intensity $I_{ab0}$ at the location of the gain layer is given $$\alpha = \frac{\alpha_0}{1 + \frac{I_{ab0}}{I_s}} \quad (24)$$

by:

$$I_{ab0} = \frac{(R + |r|) - |T|^2 [I_1 + I_2 + 2\sqrt{I_1 I_2}\cos\psi]}{(1 - |r|)^2(1 + a_1)(1 + a_2)} \quad (25)$$

When the relative phase $\psi$ is such that the fields add in phase inside the micro-Fabry-Perot gain structure, the competition between the counterpropagating modes of the ring laser due to saturation of the homogeneously broadened distributed gain medium is strongly reduced. The contrast $I_a/I_b$ inside the resonator is much smaller than the intensity $I_1/I_2$ outside. As the phase difference $\psi$ evolves with time, as, for example in the case of an unlocked gyro, destructive interferences will eventually result in a smaller internal field in the resonator. In that situation, the field contrast may be important, but saturation of the gain is also reduced. The influence of cross saturation on the bidirectional ring laser operation is thus too complex to be determined by analytical methods.

A numerical simulation of the operation of the laser gyro of the invention was made incorporating the multilayer resonator structure 100 as a gain element. The field gains for each direction (which are the differences $T_i$1) and the backscattering R are computed from the above equations taking into account the intensity dependence of both the localized and distributed gains implied by Eqs. (23) and (25). The system of laser gyro equations for that amplifier structure is:

$$\frac{dI_i}{d(t/\tau_c)} = 2(|T_i| - 1) - a_1 I_i + 2\sqrt{I_i I_j}\ |R_j|\cos[\psi + (-1)^j \epsilon_j] \quad (26)$$

$$\frac{d\psi}{d(t/\tau_c)} = \Delta\Omega\tau_c - \left[|R_1|\sqrt{\frac{I_1}{I_2}}\sin(\psi - \epsilon_1) + |R_2|\sqrt{\frac{I_2}{I_1}}\sin(\psi + \epsilon_2)\right] \quad (27)$$

In Eqs. (21)–(27), $\tau_c$ is the cavity round-trip time, $\Delta\Omega$ is the mode pulling, $\lambda l$ is the linear loss factor, $R_j$ is the global scattering coefficient calculated for the beam $I_j$ with phase $\epsilon_j$. It is known that the scattering of one beam into the other during each cavity round-trip can be represented by a single scattering coefficient.

The system of equations (21)–(27) is solved numerically. After an initial transient, a periodic steady state is achieved for the functions $I_i(t)$ and $\psi(t)$. The average beat frequency, as may be measured by a spectrum analyzer, is the average over one period of $\psi$ weighted by the product of the fields or by $I_1 I_2$. An example of gyro simulation is shown in FIG. 3 where the ratio of the beat frequency between the two outputs to the mode pulling $\Delta\Omega$, is plotted as a function of $\Delta\Omega T$.

Curve A corresponds to a laser with a series of thin (i.e. $d << \lambda$) amplifying layers for a total gain of $\alpha = 0.4$, and linear losses totaling $\alpha_1 = 0.4$, and no resonant structure ($r = 0$ and $a = 0$). Even in this idealized situation where the scattering of the cavity components is neglected, a large dead band is observed in the gyro response. For comparison, Curve B corresponds to a cavity with a similar thin film unsaturated gain ($\alpha_1 = 0.40025$) incorporated in a resonant structure as provided by the instant invention as shown, for example in FIG. 4, with $r = 0.98$. An unsaturated distributed gain of $a_0 = 0.000292$ is chosen. The linear loss factor is $\alpha_1 = 0.01157$. The lock-in threshold is reduced by several orders of magnitude, as compared to the situation without the resonant structure of the invention shown by curve A. It has been verified that the inclusion of a small phase factor, for example $\epsilon = 0.1$, does not appreciably change the gyro response. Despite the homogeneous nature of the broadening, the time evolution of the beam intensities remains stable for an imbalance of 5% of the initial intensities.

A significant feature of the thin layer structure of the gain medium is that $\alpha_1 = \alpha_{21}$ and $\alpha_2 = \alpha_{12}$. These equalities express that the backward stimulated emission is as large as the forward stimulated emission. This can be understood by considering the angular distribution of the stimulated emission as the collective emission of a large number of atomic dipole moments excited by an intense laser beam. When the configuration of FIG. 1 is used as an active laser gyroscope, this feature causes a strong coupling between the two counterpropagating waves, and therefore leads to a large dead band.

We claim:

1. A ring laser apparatus for spontaneous-emission-free detection comprising:
   (a) laser ring means including a means for providing an output from the laser ring means;
   (b) means for detecting;
   (c) a means for providing gain located within the laser ring; and
   (d) a beam splitter wherein the laser ring means and the gain means are structured and arranged such that an energy source stimulates the gain means, further wherein the gain means thereby produces first and second oppositely traveling laser beams along first and second pathways, each of the pathways having equal path lengths, wherein further the first and second oppositely traveling beams include first and second oppositely traveling spontaneous emission components, wherein a portion of each of the first and second oppositely traveling beams are output through the laser ring output means into the beam splitter, so that the oppositely directed first and second spontaneous emission components are highly coherent on the beam splitter such that the beam splitter provides a detection signal free of spontaneous emission noise to the detector means.

2. The apparatus of claim 1 wherein the gain means comprises a gain resonator having a distributed gain bounded by first and second dielectrics and a gain material having a thickness which is substantially less than a wavelength wherein the gain material is located between the first and second dielectrics and is separated from each dielectric by a distributed gain medium.

3. The apparatus of claim 1 wherein the laser ring means is formed by first, second and third mirrors.

4. The apparatus of claim 1 wherein the laser ring means is formed by a fiber waveguide.

5. The apparatus of claim 1 wherein the laser ring means is formed by a solid state waveguide.

6. The apparatus of claim 1 wherein the gain means is substantially comprised of $GaAl_xAs_{1-x}$.

7. The apparatus of claim 2 wherein the gain means is substantially comprised of $GaAl_xAs_{1-x}$.

8. The apparatus of claim 2 wherein each of the first and second dielectrics and the gain material between the dielectrics comprise multilayer structures and wherein the gain material between the dielectrics comprises a plurality of alternating layers of subwavelength thickness of gain material and a third dielectric, and wherein each gain layer is separated from the next by a layer of the third dielectric having a thickness of about one-half of a wavelength.

9. The apparatus of claim 1 wherein the gain means comprises a multiple quantum well structure having multilayer coatings.

10. The gain means of claim 8 wherein the third dielectric comprises a semiconductor material.

11. A ring laser apparatus for spontaneous-emission-free detection comprising:
  a. a plurality of mirrors wherein at least three of the plurality of mirrors including a first, second and third mirror are arranged to form a laser ring;
  b. a detector;
  c. a gain element located between two of the first, second and third mirrors within the laser ring; and
  d. a beam splitter wherein the plurality of mirrors and the gain element are structured and arranged such that an energy source stimulates the gain element, further wherein the gain element thereby produces first and second oppositely traveling laser beams along first and second pathways, each of the pathways having equal path lengths, wherein further the first and second oppositely traveling beams include first and second oppositely traveling spontaneous emission components, each of the first and second oppositely traveling beams provide an output through one of the laser ring mirrors and are reflected into the beam splitter after respectively striking fourth and fifth mirrors of the plurality of mirrors, further wherein the gain element comprises a gain layer having a thickness which is much smaller than a wavelength so that the oppositely directed first and second spontaneous emission components are highly coherent on the beam splitter such that the beam splitter provides a detection signal free of spontaneous emission noise to the detector.

12. The apparatus of claim 11 wherein the gain element comprises a gain resonator having a distributed gain bounded by first and second dielectrics and a gain material having a thickness which is substantially less than a wavelength wherein the gain material is located between the first and second dielectrics and is separated from each dielectric by a distributed gain medium.

13. The apparatus of claim 11 wherein the laser ring formed by the first, second and third mirrors is in air.

14. The apparatus of claim 11 wherein the laser ring formed by the first, second and third mirrors is located within a fiber waveguide.

15. The apparatus of claim 11 wherein the laser ring formed by the first, second and third mirrors is located within a solid state waveguide.

16. The apparatus of claim 11 wherein the gain element is substantially comprised of $GaAl_xAs_{1-x}$.

17. The apparatus of claim 12 wherein the gain element is substantially comprised of $GaAl_xAs_{1-x}$.

18. The apparatus of claim 12 wherein each of the first and second dielectrics and the gain material between the dielectrics comprise multilayer structures and wherein the gain material between the dielectrics comprises a plurality of alternating layers of subwavelength thickness of gain material and a third dielectric, and wherein each gain layer is separated from the next by a layer of the third dielectric having a thickness of about one-half of a wavelength.

19. The apparatus of claim 11 wherein the gain element further comprises a multiple quantum well structure.

20. The apparatus of claim 18 wherein the third dielectric comprises a semiconductor material.

21. The apparatus of claim 1 wherein the energy source comprises a source of electrical energy.

22. The apparatus of claim 1 wherein the energy source comprises an external radiation source.

23. The apparatus of claim 11 wherein the energy source comprises a source of electrical energy.

24. The apparatus of claim 11 wherein the energy source comprises an external radiation source.

* * * * *